US006417745B1

(12) United States Patent
Taniguchi

(10) Patent No.: US 6,417,745 B1
(45) Date of Patent: Jul. 9, 2002

(54) LC FILTER WITH A COUPLING CAPACITOR FORMED BY SHARED FIRST AND SECOND CAPACITOR PATTERNS

(75) Inventor: Tetsuo Taniguchi, Takefu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/557,360

(22) Filed: Apr. 25, 2000

(30) Foreign Application Priority Data

Apr. 26, 1999 (JP) ............................ 11-117790

(51) Int. Cl.$^7$ ................................. H03H 7/01
(52) U.S. Cl. ....................... 333/185; 333/175
(58) Field of Search ................... 333/167, 175, 333/185, 124

(56) References Cited

U.S. PATENT DOCUMENTS 1,708,950 A * 4/1929 Norton ...................... 333/167

FOREIGN PATENT DOCUMENTS

JP 3-155609 * 7/1991 ................. 333/181

OTHER PUBLICATIONS

Williams, "Electronics Filter Design Handbook," 1981, McGraw–Hill, pp. 5–26 & 5–27.*

* cited by examiner

Primary Examiner—Justin P. Bettendorf
(74) Attorney, Agent, or Firm—Keating & Bennett, LLP

(57) ABSTRACT

An LC filter has a ratio of the inductance of an inductor to the capacitance of a capacitor, defining an input-side parallel LC resonant circuit, which is different from a ratio of the inductance of an inductor to the capacitance of a capacitor, defining an output-side parallel LC resonant circuit. The inductor of the input-side parallel LC resonant circuit includes inductor patterns. The inductor of the output-side parallel LC resonant circuit includes different inductor patterns. The capacitor of the input-side circuit includes capacitor patterns. The capacitor of the output-side circuit includes different capacitor patterns.

14 Claims, 4 Drawing Sheets

LC FILTER WITH A COUPLING CAPACITOR FORMED BY SHARED FIRST AND SECOND CAPACITOR PATTERNS

BACKGROUND OF THE INVENTION

1. Field of the Invention

The present invention broadly relates to LC filters, and more particularly, relates to LC filters included in mobile communication devices, such as cellular telephones, and various electronic devices.

2. Description of the Related Art

Generally, a conventional high-frequency band-pass LC filter includes parallel LC resonant circuits, having the same impedance and coupled by mutual inductance coupling (M-coupling) or capacitive coupling. FIG. 5 is an exploded perspective view of a conventional LC filter, and FIG. 6 is an electrical equivalent circuit of the conventional LC filter.

Referring to FIG. 6, a conventional LC filter 100 includes an input-side parallel LC resonant circuit 1 and an output-side parallel LC resonant circuit 2, which are capacitively-coupled by a coupling capacitor C3. Referring now to FIG. 5, on ceramic sheets 5, the LC filter 100 includes an inductor pattern 7 of an inductor L1 and capacitor patterns 9a and 9b of a capacitor C1, which form the input-side parallel LC resonant circuit 1. The LC filter 100 further includes, on the ceramic sheets 5, an inductor pattern 8 of an inductor L2 and capacitor patterns 10a and 10b of a capacitor C2, which define the output-side parallel LC resonant circuit 2. The LC filter 100 also includes a capacitor pattern 11 of the coupling capacitor C3 on the ceramic sheet 5. These sheets are stacked and monolithically baked to define a surface-mounting electronic device. The inductor pattern 7 of the inductor L1 is connected to an input terminal 101 (see FIG. 6) at a leading portion 7a extending from the center thereof. Similarly, the inductor pattern 8 of the inductor L2 is connected to an output terminal 102 (see FIG. 6) at a leading portion 8a extending from the center thereof.

The inductor pattern 7 of the inductor L1 and the inductor pattern 8 of the inductor L2 have the same pattern configuration and the same size. The capacitor patterns 9a and 9b of the capacitor C1 and the capacitor patterns 10a and 10b of the capacitor C2 have the same pattern configuration and the same size. Therefore, the ratio L/C of the inductance of the inductor L1 to the capacitance of the capacitor C1, which define the input-side parallel LC resonant circuit 1, is equal to the ratio L/C of the inductance of the inductor L2 to the capacitance of the capacitor C2, which define the output-side parallel LC resonant circuit 2. Hence, the input impedance and the output impedance of the LC filter 100 are equal.

Since the input impedance and the output impedance of the conventional LC filter 100 are the same, when respective external circuits connected to the input side and the output side have different impedances, it is necessary to connect impedance matching circuits to the input side and the output side, respectively, in order to match the impedance with the external circuits. It is therefore necessary to provide an area on the LC filter to accommodate the impedance matching circuits. Further, characteristics of the LC filter 100 may vary due to the effect of the connected impedance matching circuits.

The inductor patterns 7 and 8 are located adjacent to each other on the same ceramic sheet 5. Therefore, electromagnetic coupling of the inductor patterns 7 and 8 must also be considered. When the inductances of the inductors L1 and L2 are changed by changing the configurations of the inductor patterns 7 and 8 due to a change in a design specification or other reason, the electromagnetic coupling between the parallel LC resonant circuits 1 and 2 is also changed. This requires a re-examination of design constants.

SUMMARY OF THE INVENTION

To overcome the problems described above, preferred embodiments of the present invention provide an LC filter having desired input/output impedances in which design changes can easily be made.

To this end, according to one preferred embodiment of the present invention, an LC filter preferably includes a plurality of parallel LC resonant circuits. The ratio of the inductance of a first inductor relative to the capacitance of a first capacitor, which define an input-side parallel LC resonant circuit, is different from the ratio of the inductance of a second inductor relative to the capacitance of a second capacitor, which define an output-side parallel LC resonant circuit. Preferably, the first and second inductors of the parallel LC resonant circuits each include inductor patterns having a layered structure.

With this arrangement, the input-side parallel LC resonant circuit and the output-side parallel LC resonant circuit each have resonant frequencies approximately equal to the center frequency of the LC filter. Each of the resonant frequencies is determined by the product of the inductance of the inductor and the capacitance of the capacitor, which define the parallel LC resonant circuit. The ratio of the inductance of the first inductor relative to the capacitance of the first capacitor, which define the input-side parallel LC resonant circuit, is different from the ratio of the inductance of the second inductor to the capacitance of the second capacitor, which define the output-side parallel LC resonant circuit. Therefore, the input impedance and the output impedance of the LC filter may be set to the desired impedances.

Preferably, the parallel LC resonant circuits, which are adjacent, are coupled by a coupling capacitor. The inductor patterns constituting each of the first and second inductors in the adjacent parallel LC resonant circuits may be disposed, in a thickness direction of the layered member, with capacitor patterns defining the coupling capacitor and capacitor patterns defining each of the first and second capacitors in the adjacent parallel LC resonant circuits being disposed therebetween. Accordingly, mutual inductance coupling between the inductors in the adjacent parallel LC resonant circuits is minimized. Therefore, even when the configuration of the inductor patterns are changed to change the inductances of the inductors, characteristics of the LC filter are minimally influenced.

Other features, elements, characteristics and advantages of the present invention will become apparent from the detailed description of preferred embodiment of the present invention below with reference to the attached drawings.

DETAILED DESCRIPTION OF PREFERRED EMBODIMENTS

The present invention will be understood from the following description of the preferred embodiments taken in conjunction with the accompanying drawings. Although each preferred embodiment describes a band-pass filter by way of example, the present invention is applicable to a band-elimination filter or other filters.

Figure 1:
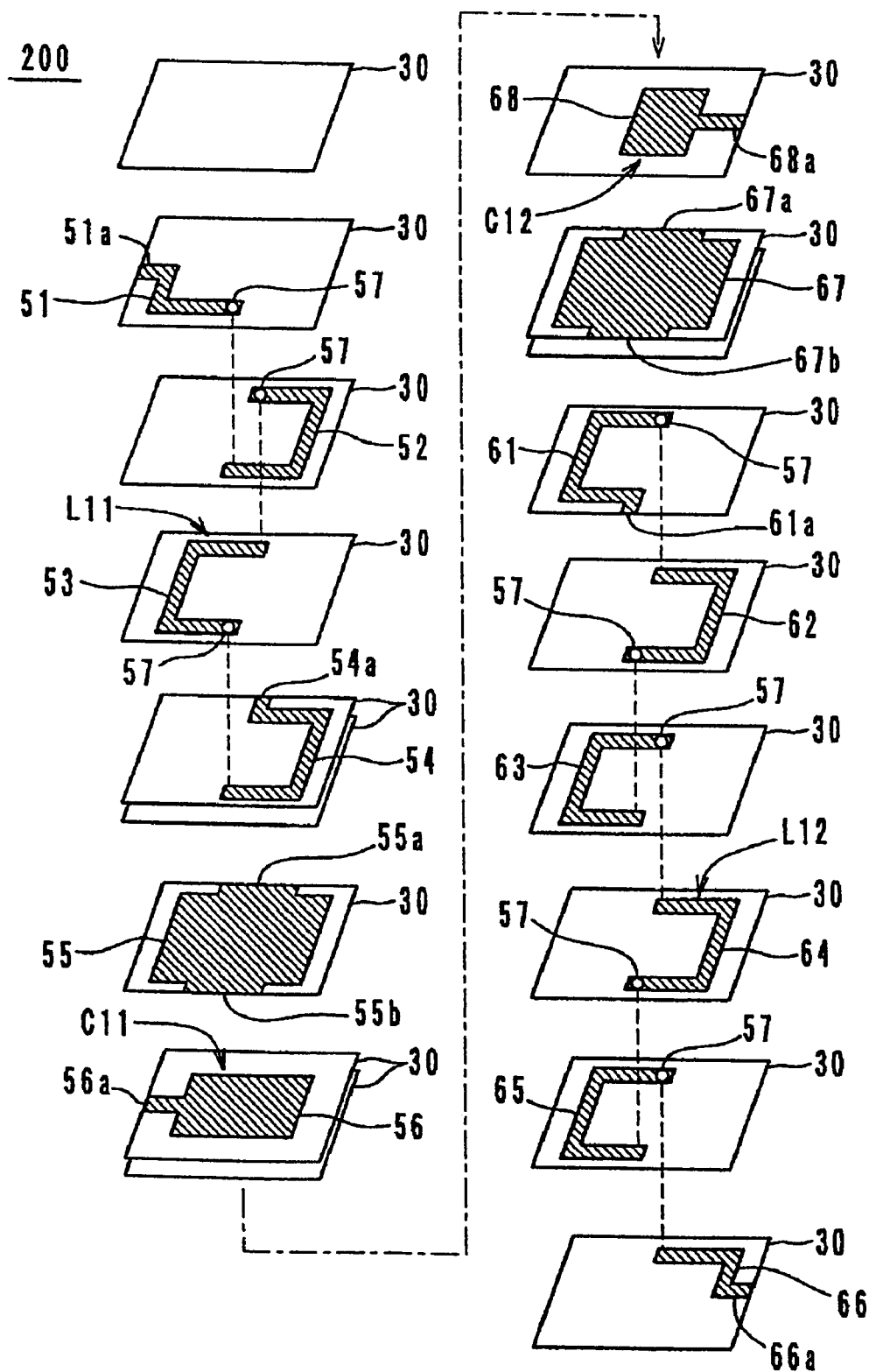
FIG. 1 is an exploded perspective view of an LC filter according to a first preferred embodiment of the present invention.
Figure 2:
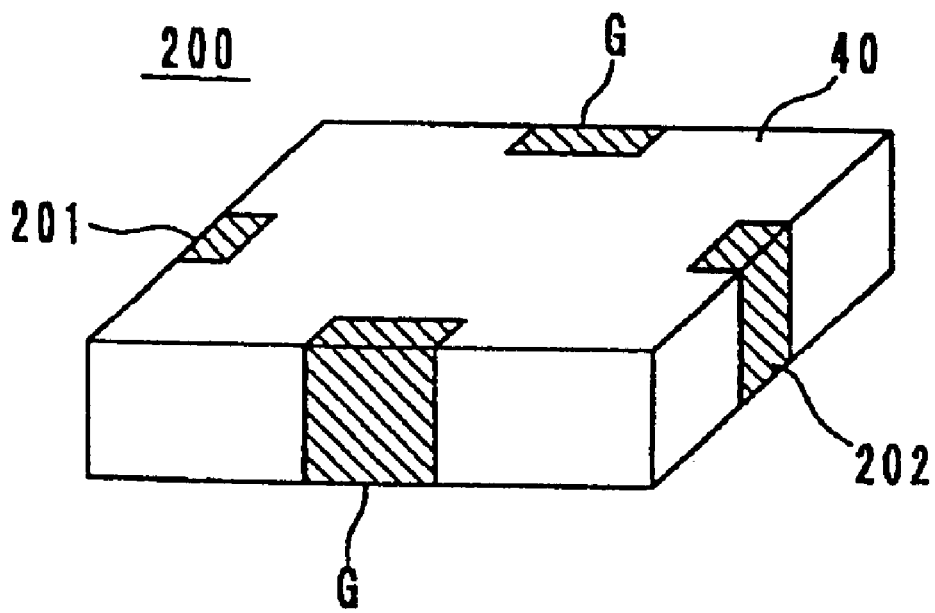
FIG. 2 is an external perspective view of the LC filter shown in FIG. 1.
Figure 3:
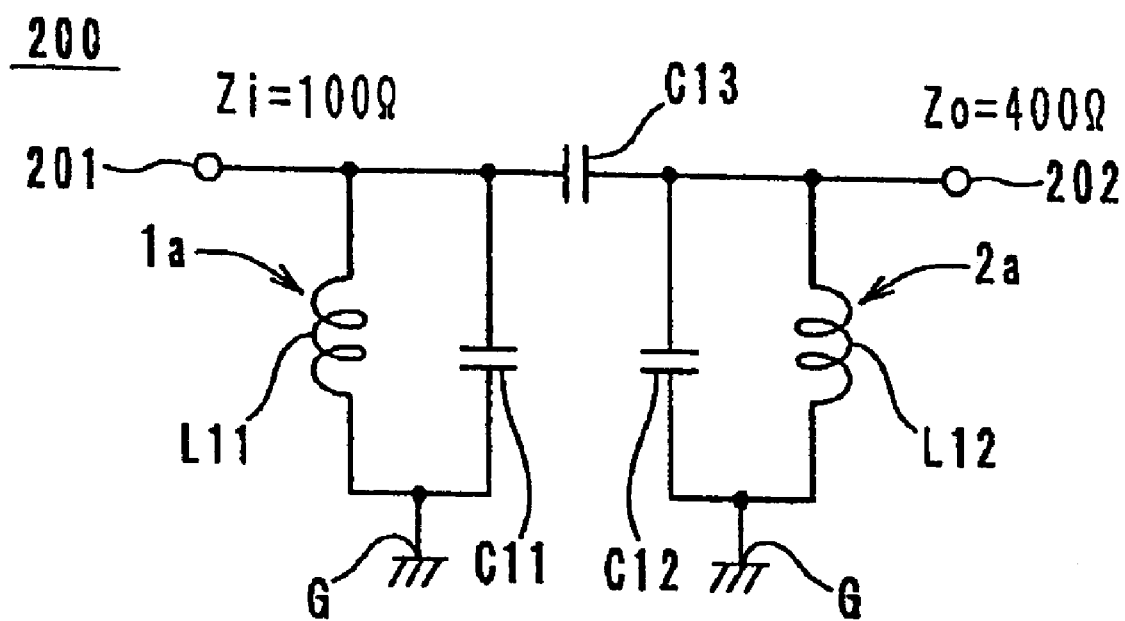
FIG. 3 is an electrical equivalent circuit diagram of the LC filter shown in FIG. 2.

FIG. 1 is an exploded perspective view of an LC filter according to a first preferred embodiment. FIG. 2 is an external perspective view of the LC band-pass filter shown in FIG. 1. FIG. 3 is an electrical equivalent circuit diagram of the LC band-pass filter shown in FIG. 1. Referring to FIG. 3, a two-stage LC band-pass filter 200 preferably includes an input-side parallel LC resonant circuit 1a and an output-side parallel LC resonant circuit 2a, which are capacitively-coupled by a capacitor C13.

Referring back to FIG. 1, the LC filter 200 includes ceramic sheets 30 on which inductor patterns 51 to 54 and 61 to 66 are provided and other ceramic sheets 30 on which capacitor patterns 55, 56, 67, and 68 are provided.

The inductor patterns 51 to 54 are electrically connected in series through via holes 57 provided in the sheets 30, thereby defining a spiral inductor L11. Similarly, the inductor patterns 61 to 66 are electrically connected in series through other via holes 57 provided in the sheets 30, thereby defining a spiral inductor L12. The capacitor patterns 55 and 56, and the capacitor patterns 67 and 68 are opposed to each other, respectively, such that the sheets 30 are interposed therebetween, defining capacitors C11 and C12, respectively. The inductor L11 and the capacitor C11 define the input-side parallel LC resonant circuit 1a. The inductor L12 and the capacitor C12 define the output-side parallel LC resonant circuit 2a (see FIG. 3).

The parallel LC resonant circuits 1a and 2a each preferably have resonant frequencies approximately equal to the center frequency of a pass band of the LC filter 200. The resonant frequency of the parallel LC resonant circuit 1a is determined by the product of the inductance of the inductor L11 and the capacitance of the capacitor C11. Similarly, the resonant frequency of the parallel LC resonant circuit 2a is determined by the product of the inductance of the inductor L12 and the capacitance of the capacitor C12.

In order to obtain the input impedance and the output impedance required by a design specification, under the conditions that should be satisfied by the resonant frequencies, the number of windings, the geometrical configuration and the size of the inductors L11 and L12 are selected accordingly. Similarly, the number of layers, the geometrical configuration and the size of the capacitors C11 and C12 are selected accordingly.

In the first preferred embodiment, the number of windings of the inductor L11 is preferably less than that of the inductor L12, thus decreasing an input impedance $Z_i$ of the LC filter 200 (for example, $Z_i$=100 Ω) and increasing an output impedance $Z_o$ of the LC filter 200 (for example, $Z_o$=400 Ω). Simultaneously, the area of the capacitor pattern 56 is greater than that of the capacitor pattern 68, thus the capacitance of the capacitor C11 is greater than that of the capacitor C12. Hence, the resonant frequency of each of the parallel LC resonant circuits 1a and 2a is approximately equal to the center frequency of the LC filter 200.

Specifically, the ratio L/C of the inductance of the inductor L11 to the capacitance of the capacitor C11 in the input-side parallel LC resonant circuit 1a is preferably different from the ratio L/C of the inductance of the inductor L12 to the capacitance of the capacitor C12 in the output-side parallel LC circuit 2a. Thus, an LC filter having the desired input impedance and output impedance is obtained.

The capacitor patterns 56 and 68 are arranged such that the sheets 30 are interposed therebetween, and the capacitance generated therebetween defines the coupling capacitor C13. The degree of coupling between the resonant circuits 1a and 2a is adjusted by, for example, changing the thickness of the sheet 30 sandwiched between the capacitor patterns 56 and 68. The capacitor patterns 55, 56, 67, and 68 are disposed between the inductor patterns 51 to 54 and the inductor patterns 61 to 66.

All of the sheets 30 in the above configuration are stacked and monolithically baked, thus forming a layered member 40, as shown in FIG. 2. An input terminal 201 and an output terminal 202 are disposed on the left and right sides, respectively, of the layered member 40. Ground terminals G are located on the front and back surfaces of the layered member 40. One end (i.e., a leading portion 51a of the inductor pattern 51) of the inductor L11 and one end (i.e., a leading portion 56a of the capacitor pattern 56) of the capacitor C11 are electrically connected to the input terminal 201. One end (i.e., a leading portion 66a of the inductor pattern 66) of the inductor L12 and one end (a leading portion 68a of the capacitor pattern 68) of the capacitor C12 are electrically connected to the output terminal 202. An end (a leading portion 54a of the inductor pattern 54) of the inductor L11 and ends (leading portions 55a and 67a of the capacitor patterns 55 and 67, respectively) of the capacitors C11 and C12 are electrically connected to the ground terminal G on the back side. An end (a leading portion 61a of the inductor pattern 61) of the inductor L12 and ends (leading portions 55b and 67b of the capacitor patterns 55 and 67, respectively) of the capacitors C11 and C12 are electrically connected to the ground terminal G on the front surface.

Accordingly, the LC filter 200 with the electrical equivalent circuit shown in FIG. 3 is obtained. In the LC filter 200, the ratio of the inductance of the inductor L11 to the capacitance of the capacitor C11 in the input-side parallel LC resonant circuit 1a is different from the ratio of the inductance of the inductor L12 to the capacitance of the capacitor C12 in the output-side parallel LC resonant circuit 2a. Therefore, the LC filter 200 may be configured to obtain the desired input impedance and the output impedance. Even when impedances of external circuits connected to the input side and the output side are different from each other, it is not necessary to connect an impedance matching circuit. This eliminates the conventional problem of variations in characteristics of the LC filter caused by the impedance matching circuit.

The capacitor patterns 55, 56, 67, and 68 are disposed between the inductors L11 and L12 in the thickness direction of the layered member 40. The capacitor patterns 55, 56, 67, and 68 minimize the mutual inductance coupling (M-coupling). Therefore, each of the parallel LC resonant circuits 1a and 2a is considered as an independent parallel LC resonant circuit, and the degree of freedom in designing the circuits is greatly increased. Specifically, even when the number of windings and the geometric arrangement are changed to achieve the desired input/output impedance of the LC filter 200, filter characteristics of the LC filter 200 are minimally influenced.

Figure 4:
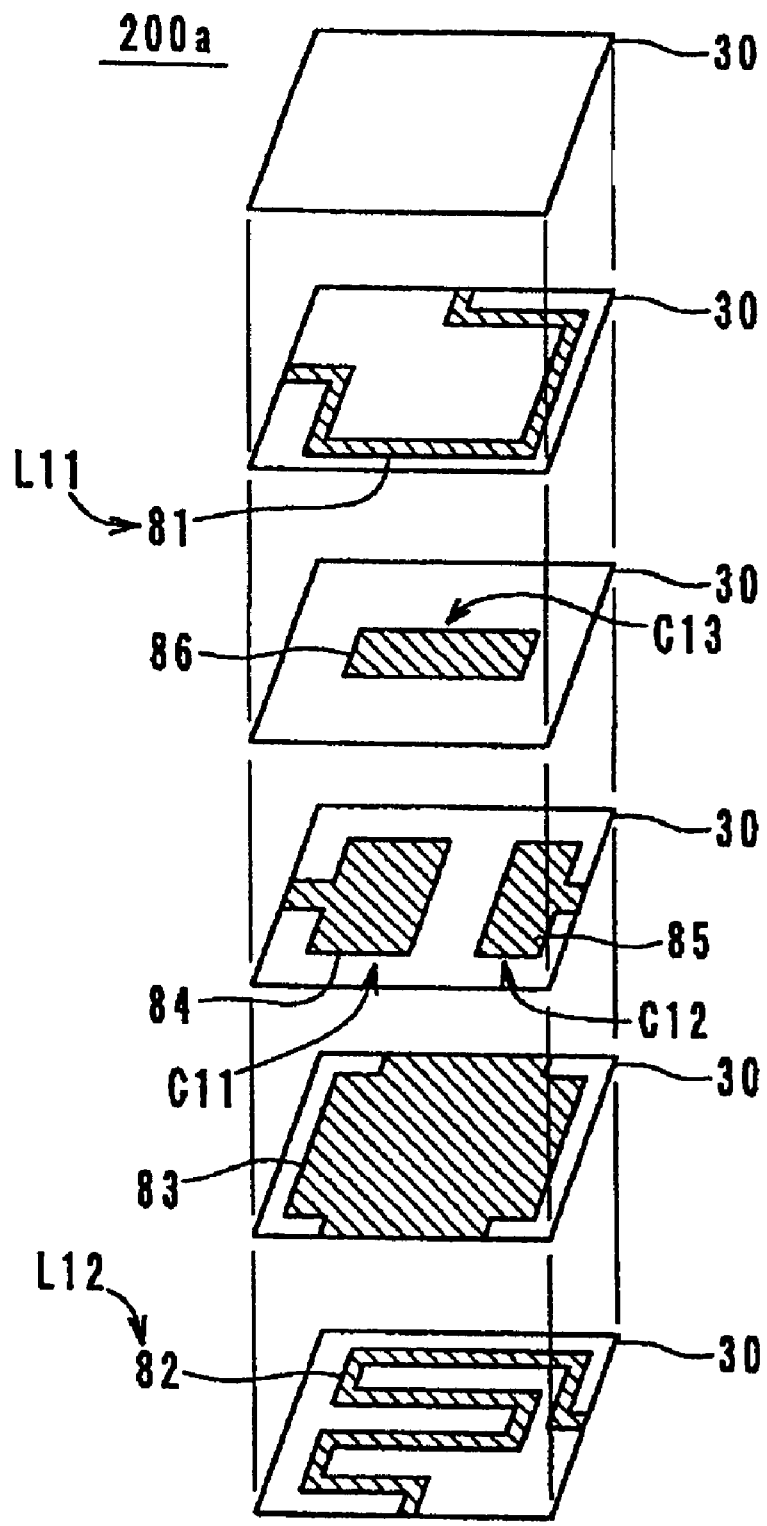
FIG. 4 is an exploded perspective view of an LC filter according to a second preferred embodiment of the present invention.
Figure 5:
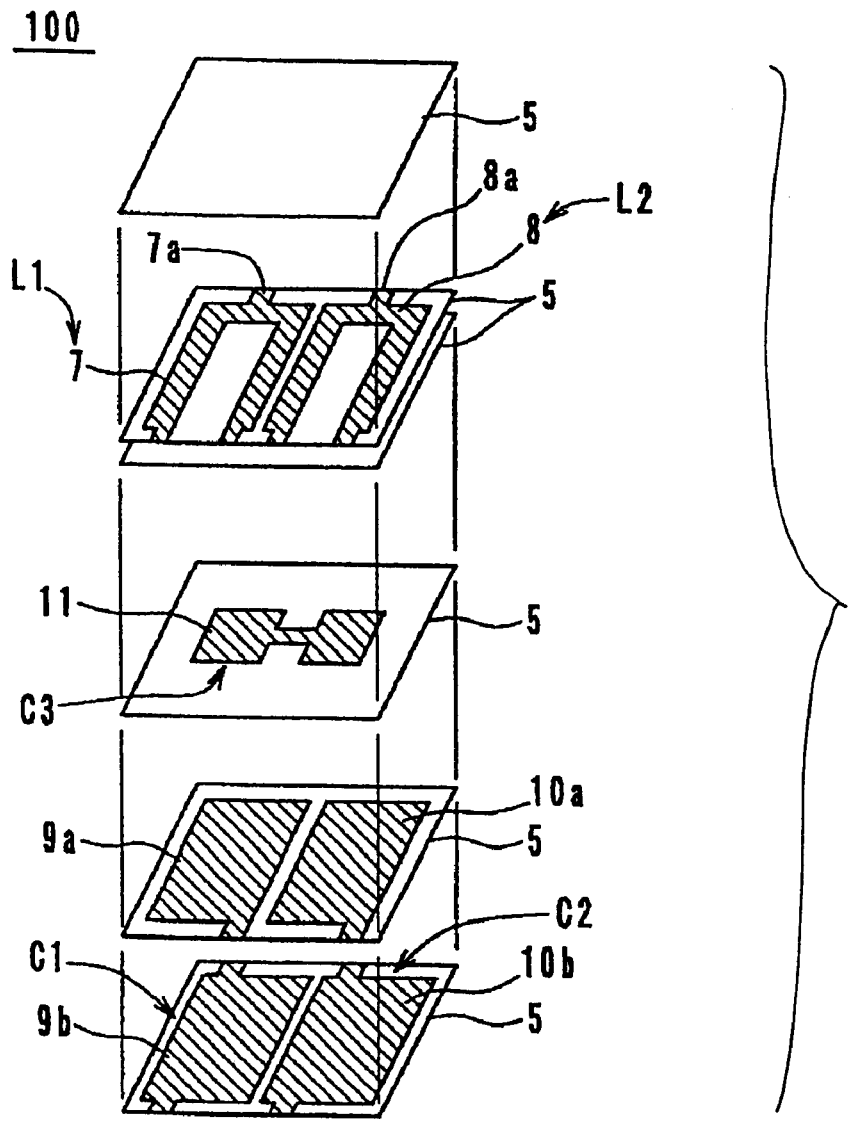
FIG. 5 is an exploded perspective view of a conventional LC filter.
Figure 6:
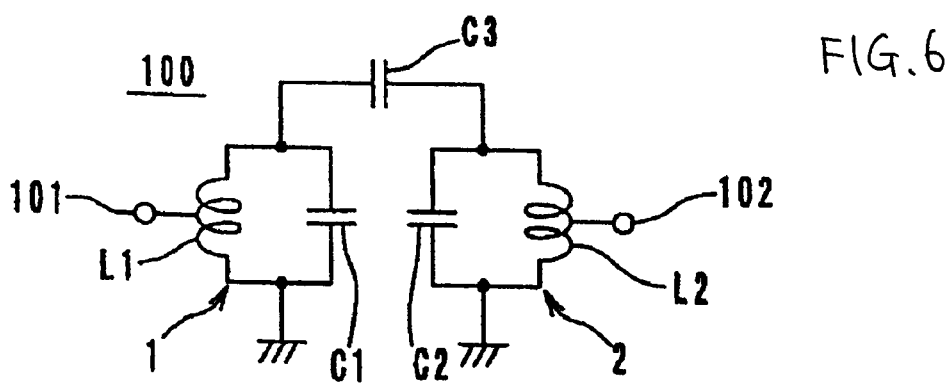
FIG. 6 is an electrical equivalent circuit diagram of the LC filter shown in FIG. 5.

Referring now to FIG. 4, an LC filter according to another preferred embodiment of the present invention is described. An external perspective view and an electrical equivalent circuit of an LC filter 200a are preferably similar as those shown in FIGS. 2 and 3, and they are thus omitted.

The LC filter 200a includes ceramic sheets 30 on which inductor patterns 81 and 82 are provided and other ceramic sheets 30 on which capacitor patterns 83 to 86 are provided.

The inductor pattern 81 defines a single-layer inductor L11 in an input-side parallel LC resonant circuit 1a. The inductor pattern 82 includes a meandering single-layer inductor L12 in an output-side parallel LC resonant circuit 2a. The capacitor patterns 83 and 84 define a capacitor C11 in the input-side parallel LC resonant circuit 1a. The capacitor patterns 83 and 85 define a capacitor C12 in the output-side parallel LC resonant circuit 2a. The capacitor patterns 84 to 86 define a coupling capacitor C13.

The LC filter 200a with the above configuration achieves the same advantages as the LC filter 200 of the first preferred embodiment.

The present invention is not limited to the above preferred embodiments. Various changes and modifications may be made in the present invention without departing from the scope of the invention. For example, the number of parallel LC resonant circuits included in the LC filter is not limited to two, and may be three or greater.

Although the present invention has been described in the context of the preferred embodiments where the ceramic sheets, on which patterns are provided, are stacked and monolithically baked, the present invention is not limited to this. The ceramic sheets used herein may be pre-baked sheets. Alternatively, the LC filter may be obtained by forming a ceramic layer with paste-like ceramic materials by a printing method or other suitable method, forming an arbitrary pattern on the surface of the ceramic pattern by applying paste-like conductive pattern materials, and obtaining a ceramic layer embedded with the pattern by applying paste-like ceramic materials over the pattern. A multi-layer LC filter is obtained in a similar manner by applying ceramic materials and conductive materials in order.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. An LC filter comprising:
   a plurality of parallel LC resonant circuits being stacked on each other in a stacking direction and including an input-side parallel LC resonant circuit having a first inductor defined by inductor patterns and a first capacitor defined by capacitor patterns, and an output-side parallel LC resonant circuit having a second inductor defined by inductor patterns and a second capacitor defined by capacitor patterns;
   said LC filter having a center frequency; and
   a capacitor section including a coupling capacitor and the first capacitor and the second capacitor; said capacitor section being disposed between said first inductor and said second inductor in said stacking direction of said parallel LC resonant circuits, said coupling capacitor being defined by one of the capacitor patterns of the first capacitor and one of the capacitor patterns of the second capacitor;
   wherein the input-side parallel LC resonant circuit and said output-side parallel LC resonant circuit each have a resonant frequency approximately equal to said center frequency of said LC filter.

2. An LC filter according to claim 1, wherein a ratio of the inductance of said first inductor relative to the capacitance of said first capacitor is different from a ratio of the inductance of said second inductor relative to the capacitance of said second capacitor.

3. An LC filter according to claim 1, wherein said first and second inductors of said parallel LC resonant circuits each include inductor patterns having a layered structure.

4. An LC filter according to claim 1, wherein said first and second inductors each includes a plurality of ceramic sheets.

5. An LC filter according to claim 4, wherein said first inductor comprises fewer ceramic sheets than said second inductor.

6. An LC filter according to claim 4, wherein a portion of said inductor patterns of said first and second inductors is disposed on each of said plurality of ceramic sheets.

7. An LC filter according to claim 1, wherein the inductance of said first inductor is lower than the inductance of said second inductor.

8. An LC filter comprising:
   a plurality of parallel LC resonant circuits being stacked on each other in a stacking direction and including an input-side parallel LC resonant circuit having a first inductor defined by inductor patterns and a first capacitor defined by capacitor patterns, and an output-side parallel LC resonant circuit having a second inductor defined by inductor patterns and a second capacitor defined by capacitor patterns; and
   a capacitor section including a coupling capacitor and the first capacitor and the second capacitor; said capacitor section being disposed between said first inductor and said second inductor in said stacking direction of said parallel LC resonant circuits, said coupling capacitor being defined by one of the capacitor patterns of the first capacitor and one of the capacitor patterns of the second capacitor; wherein
   a ratio of the inductance of said first Inductor to the capacitance of said first capacitor is different from a ratio of the inductance of said second inductor to the capacitance of said second capacitor.

9. An LC filter according to claim 8, wherein the inductance of said first inductor is lower than the inductance of said second inductor.

10. An LC filter according to claim 9, wherein said LC filter has a center frequency and the input-side parallel LC resonant circuit and said output-side parallel LC resonant circuit each have a resonant frequency approximately equal to said center frequency of said LC filter.

11. An LC filter according to claim 8, wherein said first and second inductors each includes a plurality of ceramic sheets.

12. An LC filter according to claim 11, wherein a portion of said inductor patterns of said first and second inductors is disposed on each of said plurality of ceramic sheets.

13. An LC filter according to claim 11, wherein said first inductor comprises fewer ceramic sheets than said second inductor.

14. An LC filter comprising:
   a plurality of parallel LC resonant circuits being stacked on each other in a stacking direction, each of said plurality of parallel LC resonant circuits including an input-side parallel LC resonant circuit having a first inductor defined by inductor patterns and a first capacitor defined by capacitor patterns, and an output-side parallel LC resonant circuit having a second inductor defined by inductor patterns and a second capacitor defined by capacitor patterns; and
   a capacitor section including a coupling capacitor and the first capacitor and the second capacitor; said capacitor section being disposed between said first inductor and said second inductor in said stacking direction of said parallel LC resonant circuits, said coupling capacitor being defined by one of the capacitor patterns of the first capacitor and one of the capacitor patterns of the second capacitor; wherein a ratio of the inductance of said first inductor to the capacitance of said first capacitor which defines an input-side parallel LC resonant circuit is different from a ratio of the inductance of said second inductor to the capacitance of said second capacitor which defines an output-parallel LC resonant circuit in order to match impedances with external circuits.

\* \* \* \* \*